(12) United States Patent
Wu et al.

(10) Patent No.: US 10,311,764 B2
(45) Date of Patent: Jun. 4, 2019

(54) DETECTION DEVICE AND DETECTION METHOD OF A GOA CIRCUIT OF A DISPLAY PANEL

(71) Applicants: BOE TECHNOLOGY GROUP CO., LTD., Beijing (CN); Boe (Hebei) Mobile Display Technology Co., Ltd., Hebei (CN)

(72) Inventors: Zhen Wu, Beijing (CN); Baohong Zhu, Beijing (CN); Xing Li, Beijing (CN); Jiayin Wang, Beijing (CN); Guowen Yang, Beijing (CN)

(73) Assignees: BOE TECHNOLOY GROUP CO., LTD., Beijing (CN); BOE (HEBEI) MOBILE DISPLAY TECHNOLOGY CO., LTD., Hebei (CN)

( * ) Notice: Subject to any disclaimer, the term of this patent is extended or adjusted under 35 U.S.C. 154(b) by 100 days.

(21) Appl. No.: 14/801,952

(22) Filed: Jul. 17, 2015

(65) Prior Publication Data
US 2016/0284259 A1 Sep. 29, 2016

(30) Foreign Application Priority Data
Mar. 26, 2015 (CN) .......................... 2015 1 0138220

(51) Int. Cl.
*G09G 3/00* (2006.01)
*G01R 31/28* (2006.01)
(Continued)

(52) U.S. Cl.
CPC ......... *G09G 3/006* (2013.01); *G01R 31/2894* (2013.01); *G01R 31/44* (2013.01);
(Continued)

(58) Field of Classification Search
CPC .... G09G 3/006; G09G 3/3266; G09G 3/3677; G09G 2300/0408; G09G 2310/0267; G01R 31/2894
(Continued)

(56) References Cited

U.S. PATENT DOCUMENTS

| 2011/0169793 | A1 | 7/2011 | Chen et al. |
| 2012/0203500 | A1* | 8/2012 | Ma .......................... G01R 13/02 702/150 |
| 2015/0026506 | A1* | 1/2015 | Lee ..................... G06F 11/0706 714/3 |

FOREIGN PATENT DOCUMENTS

| CN | 101315508 A | * 12/2008 |
| CN | 102629440 | 8/2012 |

(Continued)

OTHER PUBLICATIONS

Office action from Chinese Application No. 201510138220.5 dated Sep. 19, 2016.
(Continued)

*Primary Examiner* — Jermele M Hollington
*Assistant Examiner* — Suresh K Rajaputra
(74) *Attorney, Agent, or Firm* — Calfee, Halter & Griswold LLP

(57) ABSTRACT

A detection device of a GOA circuit of a display panel includes a signal supply unit for supplying a test signal to the GOA circuit; an acquisition unit for determining whether each of the GOA units in the GOA unit group of the GOA circuit has an output signal, if there is an output signal, acquiring the output signal of each of the GOA units in the GOA unit group; wherein part of the GOA units in the GOA circuit constitute the GOA unit group, the GOA unit group at least includes an initial GOA unit and a distal GOA unit of the GOA circuit; a processing unit for determining
(Continued)

whether the GOA circuit is abnormal based on the acquired output signal of each of the GOA units in the GOA unit group.

8 Claims, 5 Drawing Sheets

(51) Int. Cl.
    *G01R 31/44*     (2006.01)
    *G09G 3/3266*     (2016.01)
    *G09G 3/36*     (2006.01)

(52) U.S. Cl.
    CPC ......... *G09G 3/3266* (2013.01); *G09G 3/3677* (2013.01); *G09G 2300/0408* (2013.01); *G09G 2310/0267* (2013.01)

(58) Field of Classification Search
    USPC .................................................... 324/762.02
    See application file for complete search history.

(56) References Cited

FOREIGN PATENT DOCUMENTS

| | | |
|---|---|---|
| CN | 202383981 | 8/2012 |
| CN | 103676243 | 3/2014 |
| CN | 103995369 | 8/2014 |
| CN | 104183225 | 12/2014 |

OTHER PUBLICATIONS

Decision on Rejection from Chinese Application No. 201510138220.5 dated Jul. 13, 2017.

Office Action from China Application No. 201510138220.5 dated Jan. 26, 2017.

* cited by examiner

DETECTION DEVICE AND DETECTION METHOD OF A GOA CIRCUIT OF A DISPLAY PANEL

RELATED APPLICATIONS

The present application claims the benefit of Chinese Patent Application No. 201510138220.5, filed Mar. 26, 2015, the entire disclosure of which is incorporated herein by reference.

FIELD

This disclosure relates to the technical field of detection of a display panel, particularly to a detection device and a detection method of a GOA circuit of a display panel.

BACKGROUND

The Gate Driver on Array (GOA) technology is a process technology of directly fabricating a gate driver IC on an array substrate to replace the driving chip fabricated by an external silicon wafer. The application of this technology can reduce the production process, reduce the product cost, and improve the integration level of the thin film field effect transistor liquid crystal display (TFT-LCD) panel.

In recent years, the GOA technology has been comprehensively developed and widely applied. According to the distribution of the GOA units, the GOA panel can be classified into a unilateral GOA panel (fabricating the GOA units at the left side of the array substrate) and a bilateral GOA panel (fabricating the GOA units at both left and right sides of the array substrate, to perform driving from two sides simultaneously). From the aspects of timing control and unit TFT design, the GOA panel can also be classified into a 9T/13T (wherein T represents a TFT structure, 9T namely means that each GOA unit consists of nine TFTs, 13T namely means that each GOA unit consists of 13 TFTs) structure, a capacitive (which means that the GOA unit contains capacitors) structure, etc.

Although the GOA technology can realize a high integration level of the circuit in the display panel, it results in some problems in testing of the display panel. For example, when the GOA circuit is tested conventionally, it has to light up the display panel and supply a data signal to observe whether the GOA circuit is abnormal based on the displayed image. Therefore, the test to the GOA circuit of the display panel in the prior art can only be judged manually, which has a low efficiency and is easy to misjudge.

SUMMARY

An objective of this disclosure is to provide a detection device and a detection method of a GOA circuit of a display panel, so as to solve the problem of low efficiency and easy to misjudge in the prior art for the detection of the GOA circuit of a display panel due to the need of lighting up the display panel and the need of manual judgment.

One aspect of this disclosure provides a detection device of a GOA circuit of a display panel, comprising: a signal supply unit for supplying a test signal to the GOA circuit; an acquisition unit for determining whether each of GOA units in a GOA unit group of the GOA circuit has an output signal, if there is an output signal, acquiring the output signal of each of the GOA units in the GOA unit group; wherein part of the GOA units in the GOA circuit constitute the GOA unit group, the GOA unit group at least comprises an initial GOA unit and a distal GOA unit of the GOA circuit; and a processing unit for determining whether the GOA circuit is abnormal based on the acquired output signal of each of the GOA units in the GOA unit group.

In this exemplary embodiment, the GOA circuit is enabled to work by supplying a test signal to the GOA circuit, so as to at least acquire output signals of the initial GOA unit and the distal GOA unit of the GOA circuit, and determine whether the GOA circuit is abnormal based on the acquired output signals. Since it does not have to detect all the GOA units of the GOA circuit, the detection efficiency can be improved; meanwhile, it does not have to be judged manually, so that misjudgment is avoided.

In an exemplary embodiment, an input terminal of the GOA circuit is connected with a signal input welding plate, and an output terminal of each of the GOA units in the GOA unit group is connected with a signal output welding plate.

The signal supply unit is used for supplying the test signal to the GOA circuit through the signal input welding plate. The acquisition unit is used for determining whether there is an output signal in each of the GOA units in the GOA unit group of the GOA circuit through the signal output welding plate, and acquiring the output signal of each of the GOA units in the GOA unit group.

In an exemplary embodiment, the acquisition unit is further used for: determining that the GOA circuit is abnormal if each of the GOA units in the GOA unit group does not have an output signal. According to this embodiment, if each of the GOA units does not have an output signal, it will be determined directly that the GOA circuit is abnormal, which can improve the detection efficiency.

In an exemplary embodiment, the processing unit is used for: comparing waveforms of the acquired output signals of the GOA units, and determining that the GOA circuit is abnormal if the waveform parameters of the acquired output signals of the GOA units are inconsistent; or determining that the GOA circuit is normal if the waveform parameters of the acquired output signals of the GOA units are consistent.

In this exemplary embodiment, comparison is performed on the waveform parameters of the acquired output signals of the GOA units. In this way, even if the GOA units have similar waveforms, it can still be judged accurately whether the waveforms of the output signals of the GOA units are consistent, so as to avoid misjudgment.

In an exemplary embodiment, the waveform parameters at least include period, level amplitude, and high level retention time.

In an exemplary embodiment, the detection device further comprises a conversion unit for converting the acquired output signal of each of the GOA units in the GOA unit group into a digital signal respectively.

In an embodiment, the detection device further comprises a display unit for displaying the test signal and the acquired output signal of each of the GOA unit in waveforms. In this exemplary embodiment, the above signals are displayed in waveforms, which can be observed by the detection personnel visually.

Another aspect of this disclosure provides a detection method of a GOA circuit of a display panel, the detection method comprising: supplying a test signal to the GOA circuit; determining whether each of GOA units in a GOA unit group of the GOA circuit has an output signal, if there is an output signal, acquiring the output signal of each of the GOA units in the GOA unit group; wherein part of the GOA units in the GOA circuit constitute the GOA unit group, the GOA unit group at least comprises an initial GOA unit and a distal GOA unit of the GOA circuit; and determining whether the GOA circuit is abnormal based on the acquired output signal of each of the GOA units in the GOA unit group.

In this exemplary embodiment, the GOA circuit is enabled to work by supplying a test signal to the GOA circuit, so as to at least acquire output signals of the initial GOA unit and the distal GOA unit of the GOA circuit, and determine whether the GOA circuit is abnormal based on the acquired output signals. Since it does not have to detect all the GOA units of the GOA circuit, the detection efficiency can be improved; meanwhile, it does not have to be judged manually, so that misjudgment is avoided.

In an exemplary embodiment, an input terminal of the GOA circuit is connected with a signal input welding plate, and an output terminal of each of the GOA units in the GOA unit group is connected with a signal output welding plate.

The detection method comprises: supplying the test signal to the GOA circuit through the signal input welding plate; determining whether there is an output signal in each of the GOA units in the GOA unit group of the GOA circuit through the signal output welding plate; and acquiring the output signal of each of the GOA units in the GOA unit group.

In an exemplary embodiment, the detection method further comprises: determining that the GOA circuit is abnormal if each of the GOA units in the GOA unit group does not have an output signal. According to this embodiment, if each of the GOA units does not have an output signal, it will be determined directly that the GOA circuit is abnormal, which can improve the detection efficiency.

In an exemplary embodiment, the step of determining whether the GOA circuit is abnormal based on the acquired output signal of each of the GOA units in the GOA unit group comprises: comparing waveforms of the acquired output signals of the GOA units, and determining that the GOA circuit is abnormal if the waveform parameters of the acquired output signals of the GOA units are inconsistent; or determining that the GOA circuit is normal if the waveform parameters of the acquired output signals of the GOA units are consistent.

In this embodiment, comparison is performed on the waveform parameters of the acquired output signals of the GOA units. In this way, even if the GOA units have similar waveforms, it can still be judged accurately whether the waveforms of the output signals of the GOA units are consistent, so as to avoid misjudgment.

In an exemplary embodiment, the waveform parameters at least include period, level amplitude, and high level retention time.

In an exemplary embodiment, the detection method further comprises converting the acquired output signal of each of the GOA units in the GOA unit group into a digital signal respectively.

In an exemplary embodiment, the detection method further comprises: displaying a waveform of the test signal and a waveform of the acquired output signal of each of the GOA unit. In this embodiment, the above signals are displayed in waveforms, which can be observed by the detection personnel visually.

The beneficial effects of the present invention, which are illustrated by the exemplary embodiments of this disclosure, are as follows: the GOA circuit is enabled to work by supplying a test signal to the GOA circuit, so as to at least acquire output signals of the initial GOA unit and the distal GOA unit of the GOA circuit, and compare the acquired output signals to determine whether the GOA circuit is abnormal. Since it does not have to detect all the GOA units of the GOA circuit, the detection efficiency can be improved; meanwhile, it does not have to be judged manually, so that misjudgment is avoided.

DETAILED DESCRIPTION

Next, the implementing process of an exemplary embodiment of this disclosure will be explained in detail with reference to the drawings of the description. It should be noted that the same or similar reference signs represent the same or similar elements or elements with the same or similar functions. The embodiments described below by making reference to the drawings are exemplary, which are only used for explaining this disclosure rather than being construed as limitations to this disclosure.

Embodiment I

Figure 1:
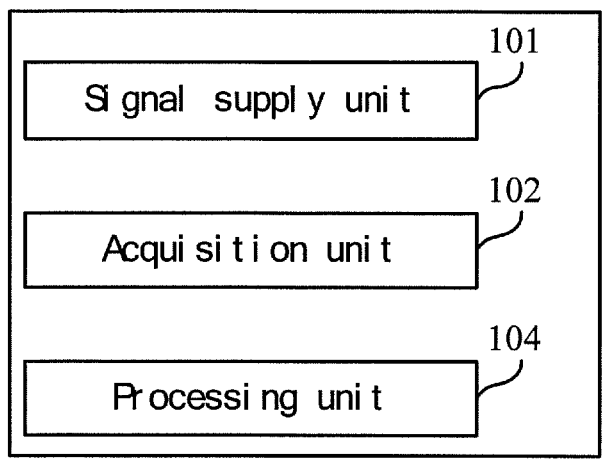
FIG. 1 is a structural block diagram of a detection device of a GOA circuit of a display panel provided by an exemplary embodiment of this disclosure.

Referring to FIG. 1, an exemplary embodiment of this disclosure provides a detection device of a GOA circuit of a display panel, the detection device comprising: a signal supply unit 101 for supplying a test signal to the GOA circuit, the test signal at least includes a power supply signal, a clock signal, and a trigger signal; an acquisition unit 102 for determining whether each of GOA units in a GOA unit group of the GOA circuit has an output signal, if there is an output signal, acquiring the output signal of each of the GOA units in the GOA unit group; wherein the GOA unit group at least comprises an initial GOA unit and a distal GOA unit of the GOA circuit; and a processing unit 104 for determining whether the GOA circuit is abnormal based on the acquired output signal of each of the GOA units in the GOA unit group.

In this embodiment, the GOA circuit is enabled to work by supplying a test signal to the GOA circuit, so as to at least acquire output signals of the initial GOA unit and the distal GOA unit of the GOA circuit, and determine whether the GOA circuit is abnormal based on the acquired output signals. Since it does not have to detect all the GOA units of the GOA circuit, the detection efficiency can be improved; meanwhile, it does not have to be judged manually, so that misjudgment is avoided.

The GOA circuit in this embodiment is equivalent to the gate driving circuit in a conventional display panel of non-GOA technology. For the conventional display panel of non-GOA technology, since the input terminal of the gate driving circuit and the output terminal of the shift register unit (equivalent to the GOA unit in this embodiment) are visible from the outside, they can be connected using silver colloid coating during the test. Whereas for the display panel of the GOA technology, since the GOA circuit is formed on an array substrate, the input terminal of the GOA circuit and the output terminal of the GOA unit are invisible from the outside. In order to test the GOA circuit, a combination of an extension line and an external welding plate can be used. For example, the following structure could be used: the input terminal of the GOA circuit is connected with a signal input welding plate, and the output terminal of each of the GOA units in the GOA unit group is connected with a signal output welding plate. Correspondingly, the signal supply unit is used for supplying a test signal to the GOA circuit through the signal input welding plate; and the acquisition unit is used for determining whether there is an output signal in each of the GOA units in the GOA unit group of the GOA circuit through the signal output welding plate, and acquiring the output signal of each of the GOA units in the GOA unit group.

It should be noted that based on the detection device provided by this embodiment, it is unnecessary to evaluate the output terminals of all GOA units through the signal output welding plate, but only needs to evaluate the output terminals of the selected GOA units through the signal output welding plate. For example, only the output terminal of the initial GOA unit and the output terminal of the distal GOA unit of the GOA circuit are evaluated through the signal output welding plate so as to perform detection externally.

The acquisition unit 102 is further used for: determining that the GOA circuit is abnormal if each of the GOA units in the GOA unit group does not have an output signal. According to this embodiment, if any of the GOA units does not have an output signal, it will be determined directly that the GOA circuit is abnormal, which can improve the detection efficiency.

The processing unit 104 is used for: comparing waveforms of the acquired output signals of the GOA units, and determining that the GOA circuit is abnormal if the waveform parameters of the acquired output signals of the GOA units are inconsistent; or determining that the GOA circuit is normal if the waveform parameters of the acquired output signals of the GOA units are consistent.

In this embodiment, comparison is performed on the waveform parameters of the acquired output signals of the GOA units. In this way, even if the GOA units have similar waveforms, it can still be judged accurately whether the waveforms of the output signals of the GOA units are consistent, so as to avoid misjudgment.

The waveform parameters at least include period, level amplitude, and high level retention time.

Figure 2:
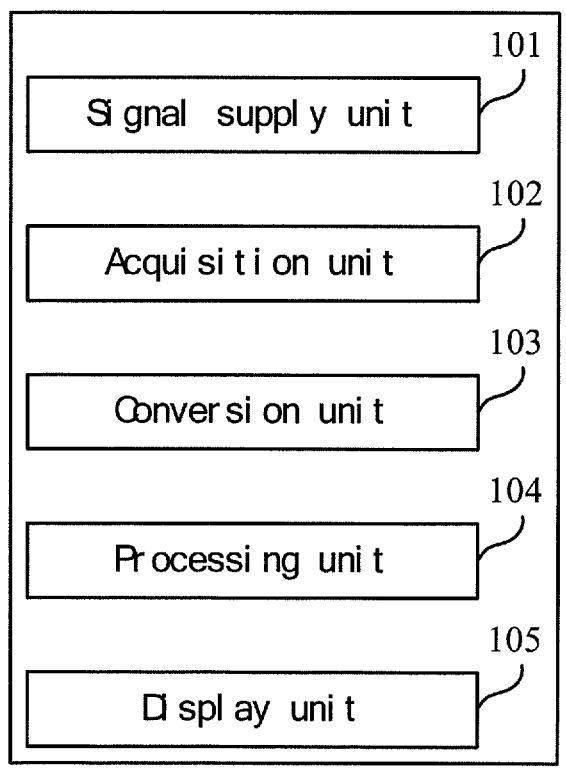
FIG. 2 is a structural block diagram of another detection device of a GOA circuit of a display panel provided by an exemplary embodiment of this disclosure.

Referring to FIG. 2, the detection device further comprises a conversion unit 103 for converting the acquired output signal of each of the GOA units in the GOA unit group into a digital signal respectively.

The detection device further comprises a display unit 105 for displaying the test signal and the acquired output signal of each of the GOA unit in waveforms. In this embodiment, the above signals are displayed in waveforms, which can be observed by the detection personnel visually.

Figure 3:
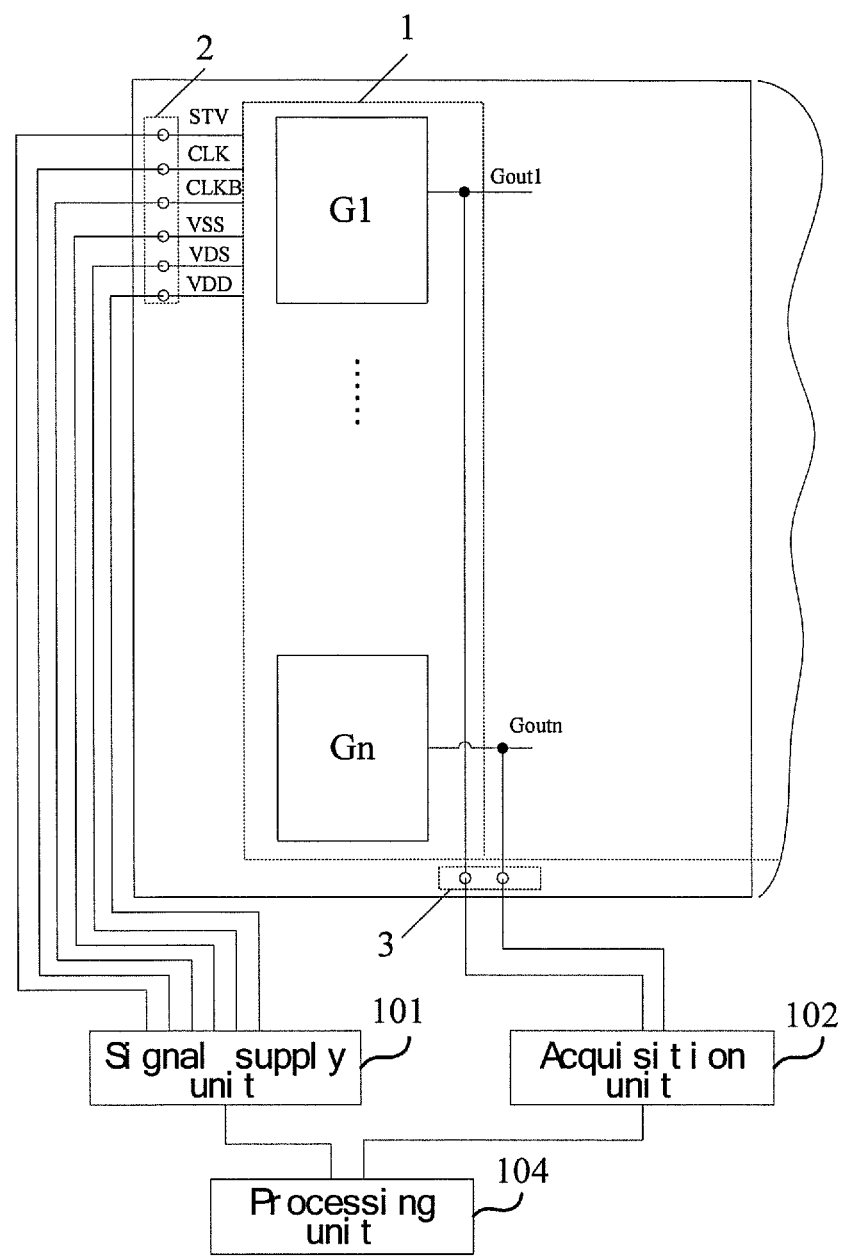
FIG. 3 is a schematic view of connection of a detection device provided by an exemplary embodiment of this disclosure with a display panel.

Referring to FIG. 3, which is a schematic view of connection of a first detection device of a GOA circuit of a display panel provided by an embodiment of this disclosure with a display panel, wherein the GOA circuit 1 comprises a plurality of GOA units, from G1 to Gn.

Take the example that the GOA unit group of the GOA circuit include an initial GOA unit G1 and a distal GOA unit Gn: the input terminal of the GOA circuit is electrically connected with a signal input welding plate 2 in the visible area of the display panel through a lead, the input terminal may include a trigger signal terminal STV, a first clock signal terminal CLK, a second clock signal terminal CLKB, a ground source VSS, a low level signal terminal VDS, a high level signal terminal VDD, etc. Due to the different structures of the GOA units, different signal terminals may be included, which can be modified simply based on this embodiment.

The output terminal Gout 1 of G1 and the output terminal Goutn of Gn are electrically connected with a signal output welding plate 3 in the visible area of the display panel through leads.

The signal supply unit 101 supplies a test signal for the GOA circuit through the signal input welding plate 2, the acquisition unit 102 determines whether the GOA circuit has output signals through the signal output welding plate 3, and acquires the output signals of G1 and Gn if there are output signals.

The processing unit 104 compares the output signal acquired by the acquisition unit 102.

Figures 4, 5A:
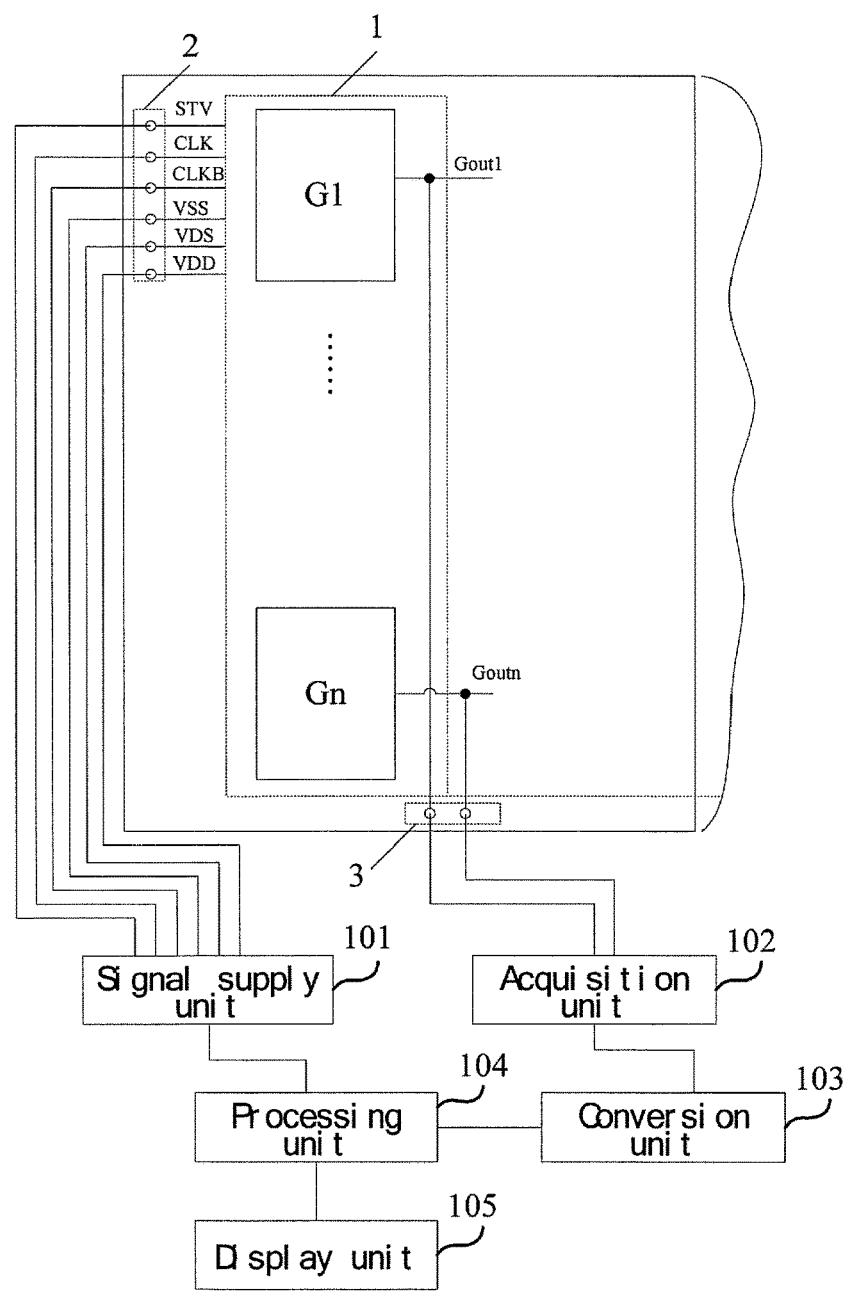
FIG. 4 is a schematic view of connection of another detection device provided by an exemplary embodiment of this disclosure with a display panel.
FIG. 5A to FIG. 5E are schematic views of part of the signal waveforms displayed by a detection device provided by an exemplary embodiment of this disclosure.

Referring to FIG. 4, which is a schematic view of connection of another detection device of a GOA circuit of a display panel provided by an embodiment of this disclosure with a display panel, the difference from the schematic view as shown in FIG. 3 lies in that the detection device of a GOA circuit of a display panel further comprises: a conversion unit 103 for converting the output signals of G1 and Gn acquired by the acquisition unit 102 into digital signals; and a display unit 105 for displaying the waveform of the signal inputted by the signal supply unit 101 and the waveform of the output signals of G1 and Gn acquired by the acquisition unit 102. Of course, the result whether the GOA circuit is abnormal can also be displayed, which will not be repeated here.

Figure 5B:
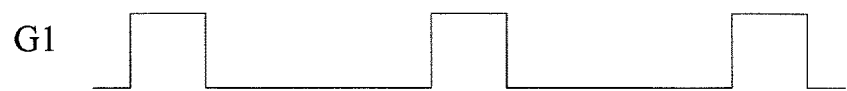
Figure 5B:
Figure 5C:
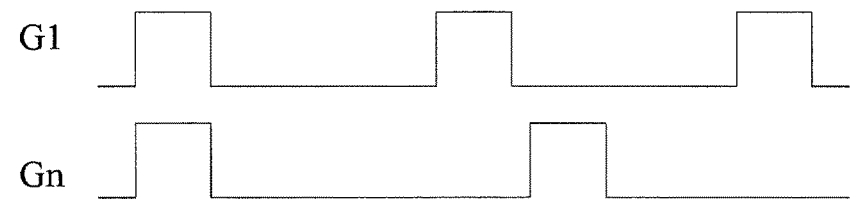
Figure 5D:
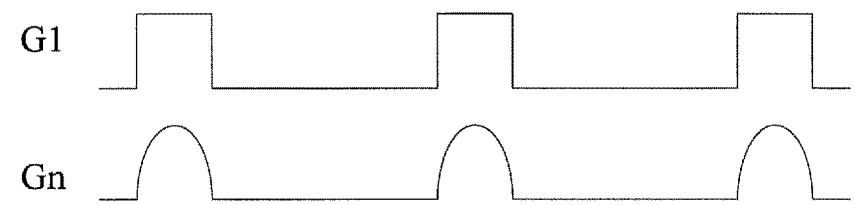
Figure 5E:
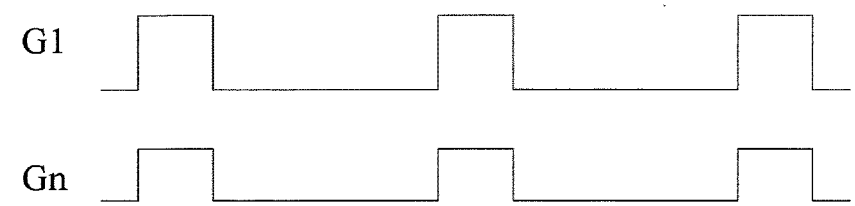

Referring to FIG. 5A to FIG. 5E, which show the waveforms of the output signals of G1 and Gn: in FIG. 5A, neither G1 nor Gn has an output signal, it can be determined that the GOA circuit is abnormal; in FIG. 58, the waveform of the output signal of G1 is normal, Gn does not have an output signal, it can be determined that the GOA circuit is abnormal; in FIG. 5C, the waveform periods of the output signal of G1 and the output signal of Gn are different, it can be determined that the GOA circuit is abnormal; in FIG. 5D, the waveform of the output signal of G1 is normal, the high level retention time of the waveform of the output signal of Gn is short, the two are inconsistent, it can be determined that the GOA circuit is abnormal; in FIG. 5E, the high level amplitudes of the waveforms of the output signal of G1 and the output signal of Gn are different, it can be determined that the GOA circuit is abnormal.

Of course, since the waveforms of the output signals of the GOA units in the GOA circuit may have phase differences, when the processing unit 104 compares the output signals of the GOA units, the influence of the phase difference should be eliminated; meanwhile, other parameters may also be used for comparison, which will not be repeated here.

Embodiment II

Figure 6:
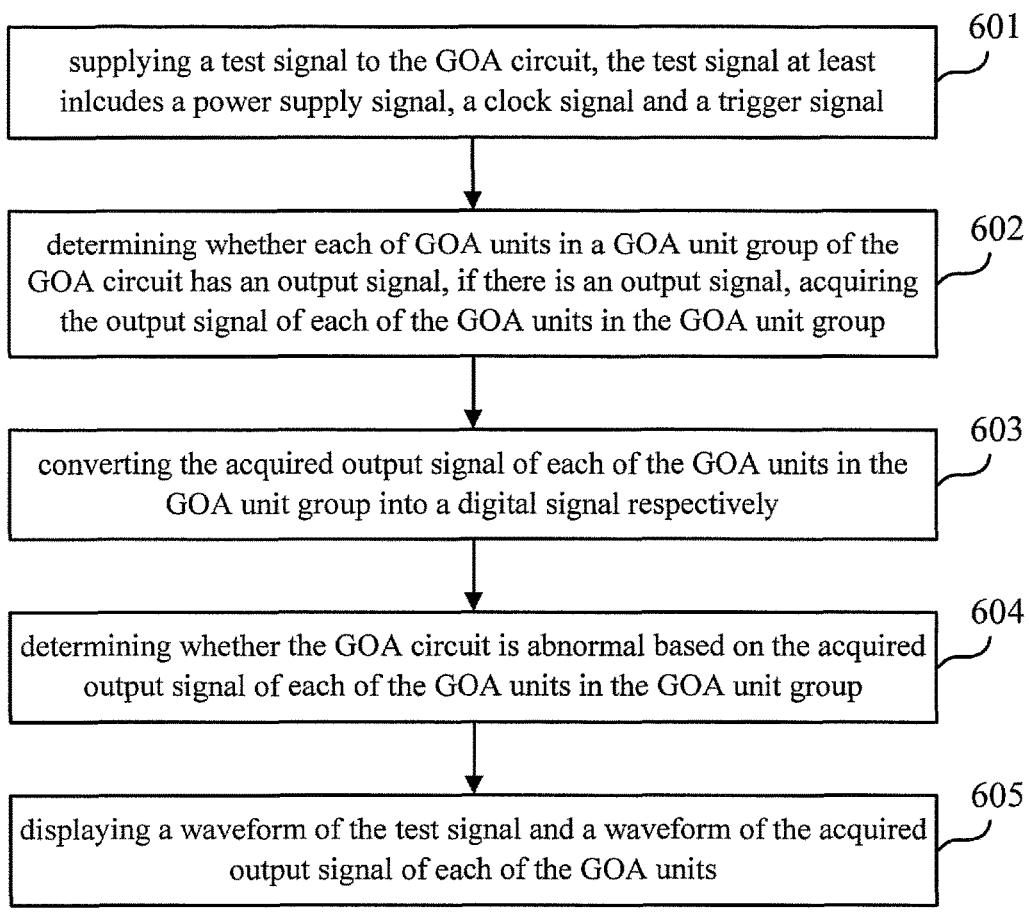
FIG. 6 is a flow chart of a detection method of a GOA circuit of a display panel provided by an exemplary embodiment of this disclosure.

Referring to FIG. 6, which is a detection method of a GOA circuit of a display panel provided by an exemplary embodiment of this disclosure, the detection method comprises:

Step 601, supplying a test signal to the GOA circuit, the test signal at least includes a power supply signal, a clock signal and a trigger signal.

Step 602, determining whether each of GOA units in a GOA unit group of the GOA circuit has an output signal, if there is an output signal, acquiring the output signal of each of the GOA units in the GOA unit group; wherein part of the GOA units in the GOA circuit constitute the GOA unit group, the GOA unit group at least comprises an initial GOA unit and a distal GOA unit of the GOA circuit.

Step 604, determining whether the GOA circuit is abnormal based on the acquired output signal of each of the GOA units in the GOA unit group.

In this embodiment, the GOA circuit is enabled to work by supplying a test signal to the GOA circuit, so as to at least acquire output signals of the initial GOA unit and the distal GOA unit of the GOA circuit, and determine whether the GOA circuit is abnormal based on the acquired output signals. Since it does not have to detect all the GOA units of the GOA circuit, the detection efficiency can be improved; meanwhile, it does not have to be judged manually, so that misjudgment is avoided.

The input terminal of the GOA circuit can be connected with a signal input welding plate, and the output terminals of the GOA units in the GOA unit group can be connected with a signal output welding plate.

In the step 601 of the detection method, the test signal can be supplied to the GOA circuit through the signal input welding plate; it is determined through the signal output welding plate whether each of the GOA unit in the GOA unit group of the GOA circuit has an output signal, and the output signal of each of the GOA unit in the GOA unit group is acquired.

The step 602 of the detection method, further comprises: determining that the GOA circuit is abnormal if each of the GOA units in the GOA unit group does not have an output signal. According to this embodiment, if any of the GOA units does not have an output signal, it will be determined directly that the GOA circuit is abnormal, which can improve the detection efficiency.

The step of determining whether the GOA circuit is abnormal based on the acquired output signal of each of the GOA units in the GOA unit group comprises: comparing waveforms of the acquired output signals of the GOA units, and determining that the GOA circuit is abnormal if the waveform parameters of the acquired output signals of the GOA units are inconsistent; or determining that the GOA circuit is normal if the waveform parameters of the acquired output signals of the GOA units are consistent.

In this embodiment, comparison is performed on the waveform parameters of the acquired output signals of the GOA units. In this way, even if the GOA units have similar waveforms, it can still be judged accurately whether the waveforms of the output signals of the GOA units are consistent, so as to avoid misjudgment.

The waveform parameters at least include period, level amplitude, and high level retention time.

The detection method further comprises:

Step 603, converting the acquired output signal of each of the GOA units in the GOA unit group into a digital signal respectively.

The detection method further comprises:

Step 605, displaying a waveform of the test signal and a waveform of the acquired output signal of each of the GOA unit. In this embodiment, the above signals are displayed in waveforms, which can be observed by the detection personnel visually.

The beneficial effects of the present invention, as illustrated by the exemplary embodiments of this disclosure, include but are not limited to: the GOA circuit is enabled to work by supplying a test signal to the GOA circuit, so as to at least acquire output signals of the initial GOA unit and the distal GOA unit of the GOA circuit, and compare the acquired output signals to determine whether the GOA circuit is abnormal. Since it does not have to detect all the GOA units of the GOA circuit, the detection efficiency can be improved; meanwhile, it does not have to be judged manually, so that misjudgment is avoided.

Apparently, the skilled person in the art can make various modifications and variants to the respective exemplary embodiments according to the present disclosure without departing from the spirit and scope of the present invention. In this way, provided that these modifications and variants belong to the scope of the claims of the present disclosure and the equivalents thereof, the present disclosure is also intended to cover these modifications and variants.

The invention claimed is:

1. A detection device of a GOA circuit of a display panel, the detection device comprising:
 a signal supply unit for supplying a test signal to the GOA circuit;
 an acquisition unit for determining whether each of GOA units in a GOA unit group of the GOA circuit has an output signal, if there is an output signal, acquiring the output signal of each of the GOA units in the GOA unit group; wherein part of the GOA units in the GOA circuit constitute the GOA unit group, the GOA unit group at least comprises an initial GOA unit and a distal GOA unit of the GOA circuit;
 a processing unit for determining whether the GOA circuit is abnormal based on the acquired output signal of each of the GOA units in the GOA unit group,
 a signal input welding plate for connecting an input terminal of the GOA circuit,
 a signal output welding plate for connecting an output terminal of each of the GOA units in the GOA unit group,
 wherein the signal supply unit is used for supplying the test signal to the GOA circuit through the signal input welding plate; the acquisition unit is used for determining whether there is an output signal in each of the GOA units in the GOA unit group of the GOA circuit through the signal output welding plate, and acquiring the output signal of each of the GOA units in the GOA unit group, and
 wherein the processing unit is used for: comparing waveform parameters, at least including period, level amplitude, and high level retention time, of each waveform of the acquired output signals of the GOA units with corresponding waveform parameters of other waveforms of the acquired output signals of the GOA units one by one, and determining that the GOA circuit is abnormal if the waveform parameters of the acquired output signals of the GOA units are inconsistent; determining that the GOA circuit is normal if the waveform parameters of the acquired output signals of the GOA units are consistent.

2. The detection device as claimed in claim 1, wherein the acquisition unit is further used for:
 determining that the GOA circuit is abnormal if each of the GOA unit in the GOA unit group does not have an output signal.

3. The detection device as claimed in claim 1, wherein the detection device further comprises a conversion unit for converting the acquired output signal of each of the GOA units in the GOA unit group into a digital signal respectively.

4. The detection device as claimed in claim 1, wherein the detection device further comprises a display unit for displaying a waveform of the test signal and a waveform of the acquired output signal of each of the GOA unit.

5. A detection method of a GOA circuit of a display panel, using a detection device comprising:
- a signal supply unit for supplying a test signal to the GOA circuit;
- an acquisition unit for determining whether each of a plurality of GOA units in a GOA unit group of the GOA circuit has an output signal, wherein if there is an output signal, acquiring the output signal of each of the GOA units in the GOA unit group, wherein part of the GOA units in the GOA circuit constitute the GOA unit group, and wherein the GOA unit group at least comprises an initial GOA unit and a distal GOA unit of the GOA circuit; and
- a processing unit for determining whether the GOA circuit is abnormal based on the acquired output signal of each of the GOA units in the GOA unit group,
- a signal input welding plate for connecting an input terminal of the GOA circuit,
- a signal output welding plate for connecting an output terminal of each of the GOA units in the GOA unit group,
wherein the signal supply unit is used for supplying the test signal to the GOA circuit through the signal input welding plate; the acquisition unit is used for determining whether there is an output signal in each of the GOA units in the GOA unit group of the GOA circuit through the signal output welding plate, and acquiring the output signal of each of the GOA units in the GOA unit group the detection method comprising:
connecting the input terminal of the GOA circuit with the signal input welding plate;
supplying a test signal to the GOA circuit through the signal input welding plate;

determining whether each of a plurality of GOA units in a GOA unit group of the GOA circuit has an output signal through the signal output welding plate; if there is an output signal, acquiring the output signal of each of the GOA units in the GOA unit group; wherein part of the GOA units in the GOA circuit constitute the GOA unit group, and wherein the GOA unit group at least comprises an initial GOA unit and a distal GOA unit of the GOA circuit; and determining whether the GOA circuit is abnormal based on the acquired output signal of each of the GOA units in the GOA unit group, wherein the step of determining whether the GOA circuit is abnormal based on the acquired output signal of each of the GOA units in the GOA unit group comprises:

comparing waveform parameters, at least including period, level amplitude, and high level retention time, of each waveform of the acquired output signals of the GOA units with corresponding waveform parameters of other waveforms of the acquired output signals of the GOA units one by one, and determining that the GOA circuit is abnormal if the waveform parameters of the acquired output signals of the GOA units are inconsistent; determining that the GOA circuit is normal if the waveform parameters of the acquired output signals of the GOA units are consistent.

6. The detection method as claimed in claim 5, further comprising:
determining that the GOA circuit is abnormal if each of the GOA unit in the GOA unit group does not have an output signal.

7. The detection method as claimed in claim 5, further comprising converting the acquired output signal of each of the GOA units in the GOA unit group into a digital signal respectively.

8. The detection method as claimed in claim 5, further comprising: displaying a waveform of the test signal and a waveform of the acquired output signal of each of the GOA unit.

* * * * *